US005879997A

United States Patent [19]
Lee et al.

[11] Patent Number: 5,879,997
[45] Date of Patent: Mar. 9, 1999

[54] METHOD FOR FORMING SELF ALIGNED POLYSILICON CONTACT

[75] Inventors: Kuo-Hua Lee; Janmye Sung, both of Lower Macungie Township, Lehigh County, Pa.

[73] Assignee: Lucent Technologies Inc., Murray Hill, N.J.

[21] Appl. No.: 707,365

[22] Filed: May 30, 1991

[51] Int. Cl.$^6$ ................................................. H01L 21/336
[52] U.S. Cl. .......................... 438/300; 438/301; 438/672
[58] Field of Search .............................. 437/186, 191–195, 437/50, 48, 52; 148/DIG. 125; 438/300, 301, 299, 675, 672

[56] References Cited

U.S. PATENT DOCUMENTS

| | | | |
|---|---|---|---|
| 4,072,546 | 2/1978 | Moneda | 437/41 |
| 4,506,437 | 3/1985 | Godejahn, Jr. | 437/186 |
| 4,822,754 | 4/1989 | Lynch et al. . | |
| 4,824,796 | 4/1989 | Chiu et al. | 437/186 |
| 4,844,776 | 7/1989 | Lee et al. . | |
| 4,849,369 | 7/1989 | Jeuch et al. | 437/50 |
| 4,981,812 | 1/1991 | Nishizaka | 437/52 |
| 5,027,187 | 6/1991 | O'Mara et al. | 437/186 |

FOREIGN PATENT DOCUMENTS

| | | | |
|---|---|---|---|
| 145 927 A1 | 6/1985 | European Pat. Off. | H01L 23/48 |
| 422 824 A1 | 4/1991 | European Pat. Off. | H01L 21/336 |
| 2339954 | 1/1977 | France | H01L 21/31 |
| 0287171 | 12/1976 | Japan | 437/40 |
| 0091827 | 7/1980 | Japan | 437/44 |
| 57-10667 | 8/1983 | Japan | 437/186 |
| 0001942 | 1/1990 | Japan | 437/191 |
| 2-42719 | 2/1990 | Japan | 437/186 |

OTHER PUBLICATIONS

IBM Technical Disclosure Bulletin, vol. 25, No. 3B, Aug., 1396–97, "Process for Simultaneously Making Silicide Gate, Source, Drain Electres", by H.J. Geipel, Jr., and S. Roberts.

Primary Examiner—Jey Tsai
Attorney, Agent, or Firm—Richard D. Laumann

[57] ABSTRACT

A gate contact to a field effect transistor is opened over the source/drain region by forming polysilicon plugs between the gate structure, which has a nitride top layer, and the field oxide regions. The contacts are formed by oxidizing and etching the gate structure and the polysilicon plugs. An oxide layer may be deposited prior to the etching. The latter step opens a gate contact but does not expose the silicon in the plug because the different oxidation rates of the polysilicon plug and the material on top of the gate structure create oxide layers having different thicknesses. The nitride is now removed and contacts formed to the gate structure.

4 Claims, 2 Drawing Sheets

METHOD FOR FORMING SELF ALIGNED POLYSILICON CONTACT

TECHNICAL FIELD

This invention relates to a method of integrated circuit manufacture which forms a self-aligned gate contact.

BACKGROUND OF THE INVENTION

As the number of components present in an integrated circuit increases, attempts are made by the skilled artisan to decrease the size of individual components to prevent the individual integrated circuit chips from becoming prohibitively large. With respect to a common component, such as field effect transistors, for example, these attempts might reduce the sizes of the source/drain regions or the channel length, i.e., the distance between the source and drain regions, thereby permitting smaller transistors to be fabricated. Additional reduction in chip size may be obtained by use of more compact electrical connections to the transistor elements. For example, the gate structure might be contacted near the source/drain regions rather than on a runner on the field oxide which electrically isolates individual devices.

See, for example, U. S. Pat. No. 4,822,754 issued on Apr. 18, 1989 to Lynch et al. and also U. S. Pat. No. 4,844,776 on Jul. 4, 1989 to Lee et al. for descriptions of approaches which permit reduction of device and feature sizes.

In addition to reducing feature size, i.e., simple scaling of device dimensions, structural changes in the devices or integrated circuit components are desirable for many reasons. For example, the source/drain regions are typically formed by ion implantation or impurity diffusion into the silicon substrate. The term substrate is used to mean a material which lies underneath and supports another material. The term thus includes an epitaxial layer, if present. Some of the problems associated with the implanted source/drain configuration can, at least in theory, be eliminated or alleviated by what is termed a raised source/drain region.

SUMMARY OF THE INVENTION

Semiconductor integrated circuits are manufactured by a method that includes forming insulating regions on a substrate and gate structures between the insulating regions. There are regions between the gate structure and the insulating regions. The gate structures have a conducting layer, insulating sidewalls and an insulating top layer formed of a first material. Plugs, comprising a second material, are now formed between the gate structure and the insulating regions, and the exposed surfaces of the gate structure and the plugs are oxidized. In a preferred embodiment, an oxide layer is now deposited over the surface, i.e., blanket deposited. Conventional patterning is used to expose selected portions of the gate structure, and the patterning is followed by an etching process that removes the portions of the oxide on the top of the first material but leaves some oxide on top of the second material, i.e., on the plug. Some of the first material may be removed. The remainder of the first material on the exposed portion of the gate structure is removed with an etch, thereby exposing the conducting material. Electrical contacts are now formed to the gate structure which extend to the insulating regions. The oxide on the plug prevents electrical contacts from being formed to the source/drain regions and permits local interconnections across gates to be formed on the still covered portions of the gate structure.

In another preferred embodiment, there is a difference between either the oxidation rates of the first and second materials or between their etching selectivities after oxidation. In one embodiment, the insulating regions comprise field oxide regions. In yet another preferred embodiment, the first material comprises silicon nitride and the second material comprises silicon. In a further preferred embodiment, impurities are implanted into the polysilicon plugs, thereby forming impurity regions, and the oxidation step causes the impurities to diffuse into the substrate to form the source/drain regions of a field effect transistor. In still another preferred embodiment, the etch used to expose the conducting material has high selectivity between the first material and the second material and the oxides on the second material. In yet another preferred embodiment, the gate structure has a layer of a third material and this layer is between the layer of first material and the conducting layer.

For reasons of clarity, the elements depicted are not drawn to scale.

DETAILED DESCRIPTION

Our invention will be described by reference to a particular embodiment. Other embodiments will be mentioned and still others will be apparent to those skilled in the art after consideration of the following description.

Figure 1:
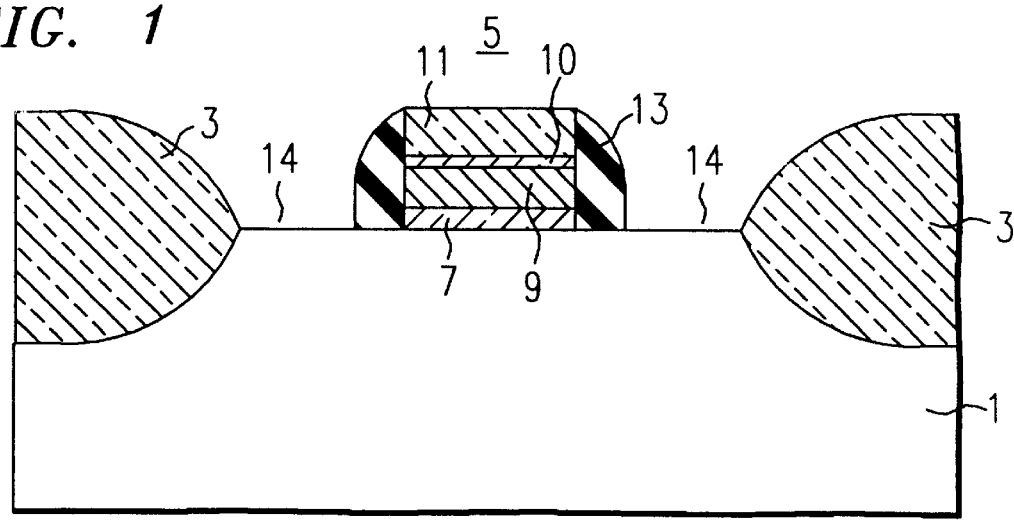
FIGS. 1–6 are sectional views of a portion of an integrated circuit at several stages in a manufacturing process according to this invention.

Depicted in FIG. 1 are substrate 1, insulating regions 3, and gate structure 5 having thin oxide 7, polysilicon layer 9, layer 10, and layer 11 comprising a first material, and insulating sidewalls 13. The thin oxide 7 is the gate dielectric, and polysilicon layer 9 is conducting. In an exemplary embodiment, the first material is a nitride. As depicted, the gate structure 5 is between the insulating regions 3 and is positioned to form regions 14 between regions 3 and gate structure 5. The insulating regions 3 electrically isolate devices from each other and are, e.g., field oxide regions. The sidewalls 13 may comprise silicon oxides, although other insulating materials, e.g., silicon nitride, may be used. The substrate 1 comprises silicon. Layer 10 is thin and comprises, e.g., an oxide, both may be omitted if desired. The structure depicted can be readily fabricated by those skilled in the art.

Figure 2:
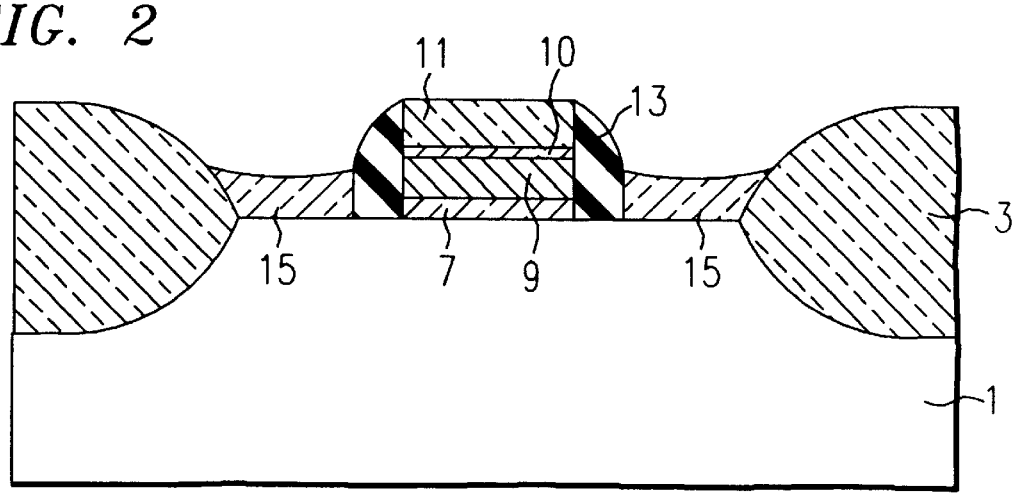

Plugs 15, comprising a second material, are now formed in regions 14 between the gate structure 5 and the field oxide regions 3. The second material comprises, e.g., polysilicon. The first and second materials should have different oxidation rates or different etch selectivities. The plugs 15 may be formed by blanket deposition of a polysilicon layer followed by an etchback which leaves the top surface of the gate structures 5 exposed or, alternatively, polysilicon may be selectively deposited on the exposed silicon between the gate structure 5 and field oxide regions 3 to the desired level. If more polysilicon is deposited than desired, the excess polysilicon may be removed by etching. The resulting structure is depicted in FIG. 2.

Figure 3:
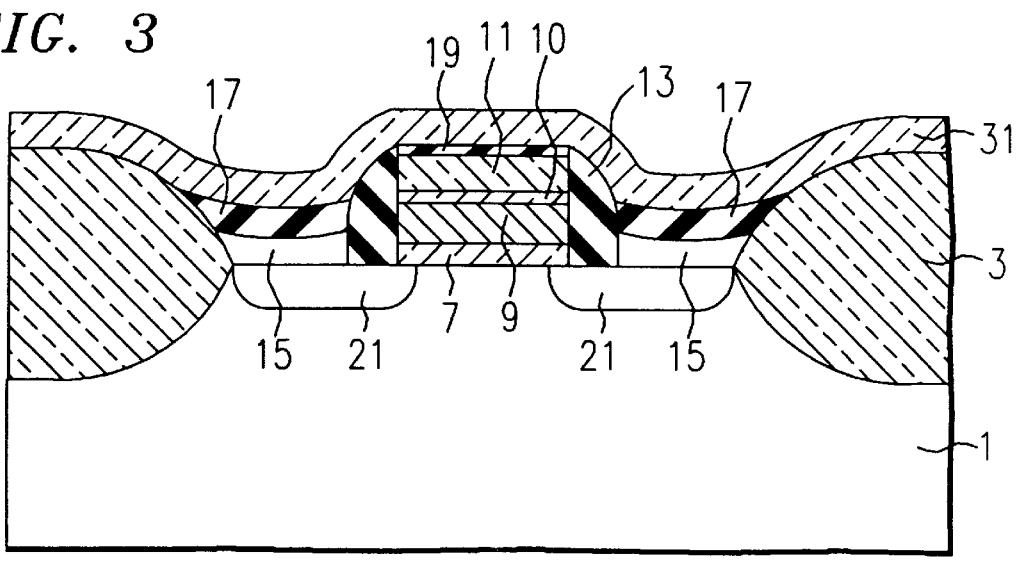

Optionally, impurities for the source/drain regions may now be implanted or otherwise put into the polysilicon, thereby forming impurity regions. Appropriate energies and concentrations will be readily selected by those skilled in the art after consideration of the desired device parameters. Alternatively, the impurities could be implanted directly into the substrate to form the source/drain, i.e., impurity, regions. An oxidation step is now performed. The oxidation step oxidizes the exposed surfaces of the polysilicon plugs 15 and of the first material, e.g., nitride, layer 11 on top of the gate structure 5 to form oxide regions 17 and 19, respectively, and may also drive the impurities into the silicon substrate to form the desired source/drain regions 21. As is well known, the polysilicon oxidizes more rapidly than does the nitride, i.e., the first and second materials have different oxidation rates, and the oxide region formed on top of the polysilicon plug is therefore thicker than is the oxide region on the first material, i.e., nitride, layer. The latter oxide region may be conveniently referred to as an oxynitride layer. This layer is desirably at least five percent as thick as was the initial layer. Alternatively, a dry oxidation step may be performed. This oxidation method does not produce an oxynitride. If a dry oxidation is used, or if the oxynitride layer is too thin, an oxide layer 31 is blanket deposited. Well-known deposited oxides, such as TEOS, may be used. This layer is desirably present. The resulting structure is depicted in FIG. 3.

Figure 4:
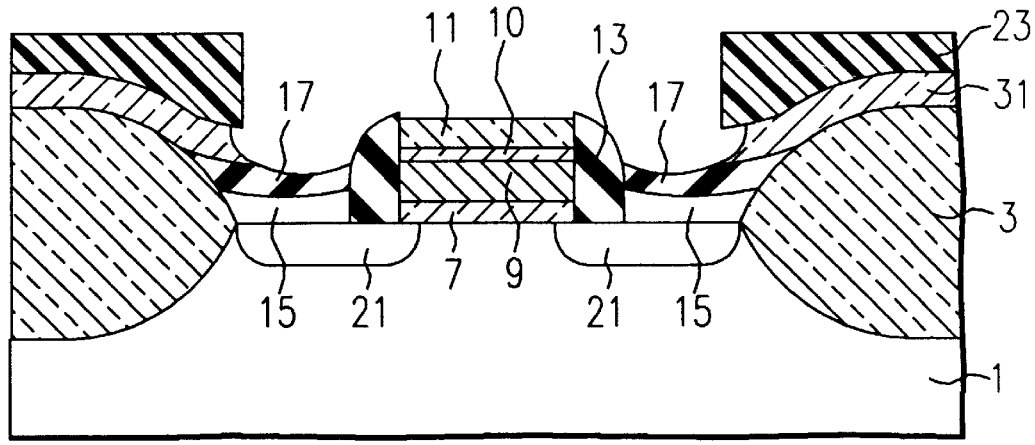

The exposed surfaces of the structure are now coated with a resist by, e.g., spinning on the resist. The resist is then patterned to form windows which expose at least a portion of the top of the gate structure 5. The window depicted is larger than is the gate structure. Portions of the oxide surface on the impurity regions will also typically be exposed. Conventional resists and lithographic patterning techniques may be used. An etch, which may be either a wet or a dry etch, is used to remove the deposited oxide 31 and oxynitride, if present, from the top of the gate structure 5 and expose the underlying nitride layer 11 in the gate structure. Typically, part of the thermal oxide on the plug is also removed. However, because the different oxidation rates of polysilicon and nitride form a thicker oxide on the polysilicon and because of the deposited oxide, portions of oxide layer 17 are left over regions 21. It will also be appreciated that only the portion of the gate structure needed for electrical contact is exposed; the deposited oxide covers the remainder of the gate structure. The exposed portion may be over the impurity regions. Those skilled in the art will use known techniques and terminate the etch before all of the oxide on the polysilicon plugs 15 is removed. The resulting structure is depicted in FIG. 4.

Figure 5:
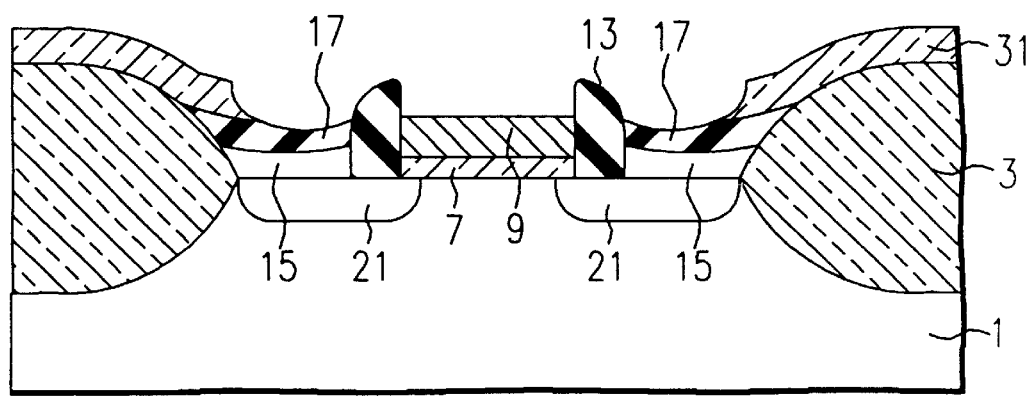

The resist is now stripped and any residual resist removed using conventional cleaning techniques. An etch having a high selectivity between oxide and nitride is now used to remove the nitride on the top of the gate structure 5 to expose the conducting layer 9. The high selectivity ensures that some oxide will remain on top of the polysilicon plugs 15, even if no deposited oxide remains, and not remove the oxide on top of the gate structure. Small portions of the tops of the insulating sidewalls 13 may be removed by this step. The resulting structure is depicted in FIG. 5. If the oxide layer 10 is present, it should also be removed to expose the conducting layer. This layer is relatively thin compared to the oxide layer on the plugs so that the plugs remain covered by an oxide layer.

Figure 6:
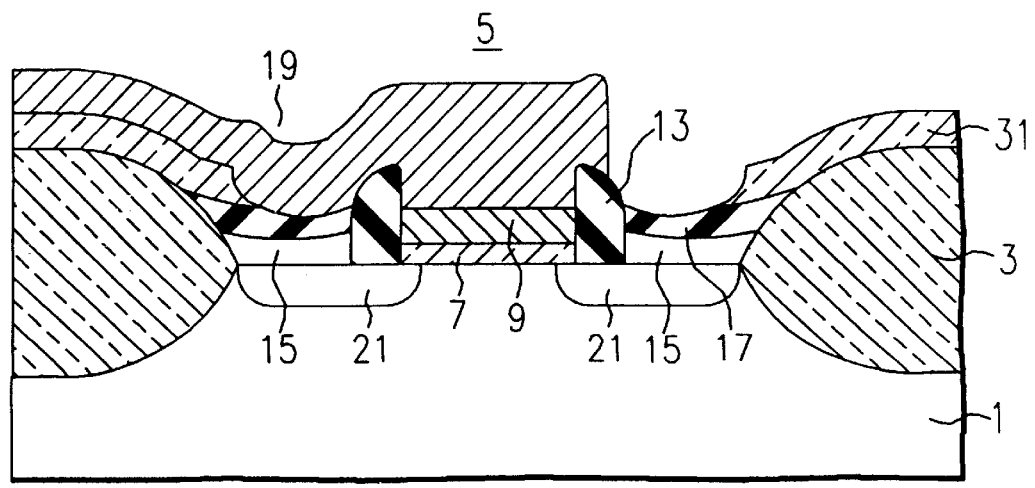

Conventional metal deposition and patterning techniques may be used to form an electrical contact 19 to the gate structure 5. The contact 19 crosses the source/drain region 21. The remaining oxide on the plug prevents electrical contacts from being made to the source/drain regions if the gate window is misaligned with respect to the source/drain region, or is, as depicted, larger than the gate structure. Some misalignment is present, but the insulating sidewalls and oxide on the plug prevent unwanted contact to the source/drain region. The resulting structure is depicted in FIG. 6.

Several comments about the process described are now appropriate. It will be appreciated that the insulating sidewalls prevent electrical contact between the polysilicon plugs 15 and the gate structure 5. Any damage caused by the nitride etch is limited to the polysilicon plug 15 and does not reach the source/drain junctions which are within the substrate or the plug interior. The oxidation step, together with the implantation step, may be used to produce shallow source/drain regions.

Other embodiments will be readily thought of by those skilled in the art. For example, materials other than nitride may be used on the gate structure.

We claim:

1. A method of semiconductor integrated circuit manufacturing comprising the steps of:

forming insulating regions on a substrate;

fabricating gate structures on said substrate between the insulating regions thereby forming regions between said gate structure and said insulating regions, said gate structures having insulating sidewalls, a conducting layer, and an insulating top layer comprising a first material;

making polysilicon plugs between said gate structure and said insulating regions; implanting impurities into said plugs;

oxidizing the surfaces of said plugs and said first material thereby causing said impurities to diffuse into the substrate to form source/drain regions of a field effect transistor, said sate structure being between said source and said drain regions;

patterning to expose at least selected portions of the gate structure;

etching to remove both the oxide on top of the first material and said first material, thereby exposing portions of said conducting layer but leaving oxide on top of the polysilicon plugs;

and forming an electrical contact to said gate structure, said contact extending over said source/drain regions and extending to said insulating regions.

2. A method as recited in claim 1 comprising the further step of depositing a layer comprising an oxide after said oxidizing step.

3. A method as recited in claim 2 in which said first material comprises silicon nitride.

4. A method as recited in claim 1 in which said electrical contact to said gate structure is over said regions.

* * * * *